United States Patent [19]

Hartgring

[11] Patent Number: 4,644,250
[45] Date of Patent: Feb. 17, 1987

[54] CIRCUIT FOR CONTROLLING RISE TIME OF EPROM PROGRAMMING VOLTAGE

[75] Inventor: Cornelis D. Hartgring, Eindhoven, Netherlands

[73] Assignee: U.S. Philips Corporation, New York, N.Y.

[21] Appl. No.: 692,153

[22] Filed: Jan. 17, 1985

[30] Foreign Application Priority Data

Jan. 25, 1984 [NL] Netherlands ............... 8400225

[51] Int. Cl.⁴ ............................................ G05F 1/618
[52] U.S. Cl. ............................... 323/225; 323/226; 323/303; 307/263; 361/58; 365/226
[58] Field of Search .............. 307/242, 263, 268, 571, 307/573, 577, 584; 323/225, 226, 274, 303, 315, 317, 901, 908; 361/58; 365/226

[56] References Cited

U.S. PATENT DOCUMENTS 4,365,316 12/1982 Iwahashi et al. ............. 365/229
4,441,172 4/1984 Ebel .............................. 365/229

*Primary Examiner*—Patrick R. Salce
*Assistant Examiner*—Jeffrey Sterrett
*Attorney, Agent, or Firm*—Robert T. Mayer; Bernard Franzblau

[57] ABSTRACT

In order to prevent an excessively fast rise of the programming voltage for an (E)EPROM, a stage is inserted which on the one hand prevents voltage losses and which on the other hand realizes the required large time constant of the voltage rise in spite of the use of small capacitances.

13 Claims, 3 Drawing Figures

CIRCUIT FOR CONTROLLING RISE TIME OF EPROM PROGRAMMING VOLTAGE

BACKGROUND OF THE INVENTION

This invention relates to a circuit for generating the programming voltage for an erasable programmable readonly memory (EPROM, EEPROM), comprising a voltage source which is connected, via a charging resistor, to the memory section to be programmed which is bridged by a (stray) capacitance.

Programmable on-volatile memories of the EPROM (erasable programmable read-only memory) and the EEPROM (electrically erasable programmable read-only memory) type have come into greater use recently because they offer the advantage of easy programming and erasing and renewed programming of the memory unit of an electric computer or microprocessor, so that flexibility as regards the input of new programs is substantially increased. Such an EPROM or EEPROM is usually integrated on a semiconductor body, often together with further arithmetic and control units forming part of the computer or microprocessor.

The programming of an EPROM or EEPROM usually requires an operating voltage which is much higher than the operating voltage of the other semiconductor elements on the semiconductor body, that is to say a voltage just below the breakdown voltage of the semicondcutor junctions, operative in the reverse direction (junction breakdown), of the semiconductor zones constituting the EPROM or EEPROM.

It has been found that EPROMs and EEPROMs are susceptible to failure not only because of the high programming voltages, but also because of the high speed at which the programming voltage applied to these memories is reached. An excessive edge steepness of the increasing programming voltage has an adverse affect on the service life (number of reprogramming operations possible) of an (E)EPROM memory cell because of the peak currents then ocurring in the injecto-oxide of the cell.

An obvious solution to this problem would be the bridging of the memory section to be programmed by a comparatively large capacitor of, for example 1000 pF, but the realization of such a capacitor on the semiconductor body requires a substantial surface area which is, of course, undesirable. Another solution would be the connection of a voltage follower, for example a source follower, in the charging circuit between the voltage source and the memory section, the gate of said follower being connected to ground via a much smaller capacitor (for example 10 pF). Due to the voltage loss between the drain and source of this source follower, however, the available programming voltage would be reduced and that would reduce the programming speed (for example, by a factor 100 slower in practice).

The invention has for an object to provide a circuit whereby the rise time of the programming voltage can be maintained within safe limits to thus mitigate all of the above drawbacks.

Summary of the Invention

The circuit in accordance with the invention is characterized in that in a circuit in parallel with a charging circuit for the memory section, which is bridged by the (stray) capacitance, there is connected a first transistor whose control electrode is controlled by the voltage on a capacitor which is connected, in series with a conductance path of a second transistor, in parallel with said capacitance of the charging circuit, said first and second transistors being connected as a current mirror which amplifies current from the second to the first transistor. This circuit can be constructed by means of bipolar transistors. However, preference is given to transistors of the field-effect type because the latter transistors make possible a substantially higher current amplication (for example, 1000×) by said current mirror and hence makes possible the use of a smaller capacitor.

BRIEF DESCRIPTION OF THE DRAWING

Embodiments of the invention will be described in detail hereinafter, by way of example, with reference to the drawing, which.

DESCRIPTION OF THE PREFERRED EMBODIMENTS

Figure 1:
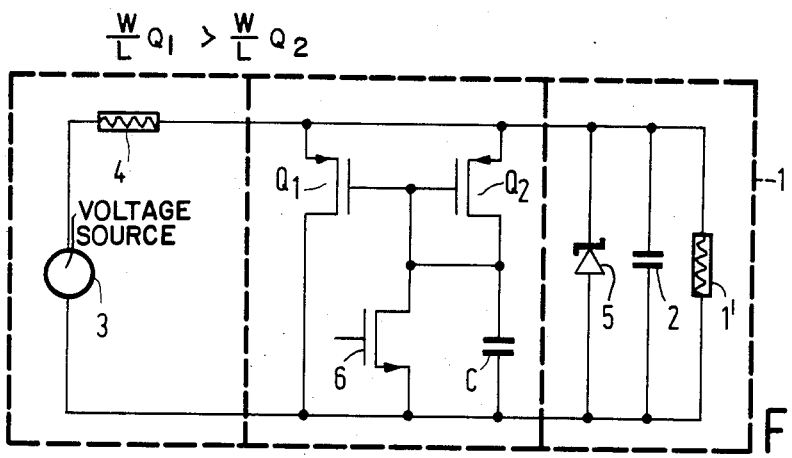
FIG. 1 shows a first embodiment.

FIG. 1 shows an equivalent diagram of a memory of the EPROM or EEPROM type. In practice the memory 1 itself has a leakage resistance 1' of more than 2 Mohms and a stray capacitance 2 of, for example, 10 pF. The semiconductor elements in the memory (formed on a semiconductor body) have a junction breakdown voltage of, for example, 20 V, which is symbolized by a zener diode 5. A voltage source 3, for example of the voltage multiplier or charge-pump type, serves to supply the programming voltage to the memory 1. The source 3 is connected to the memory 1 via a charging resistor 4.

In practice the time constant of the charging circuit formed by the charging resistor 4 (for example 1 Mohm), the capacitance 2 and the leakage resistance 1' of the memory 1 is so small that the service life of the memory 1 is adversely affected when this programming voltage is applied. In accordance with the invention, in a circuit in parallel with the stray capacitance 2 of the charging circuit there is connected a first transistor $Q_1$ whose gate is controlled by the voltage across a capacitor C which is connected, in series with a channel of a second transistor $Q_2$, in parallel with said capacitance 2. Transistors $Q_1$ and $Q_2$ are connected as a current mirror which amplifies current from $Q_2$ to $Q_1$.

Current-amplifying mirrors comprising bipolar transistors can be realized in a simple manner by a suitable choice of the emitter areas of these transistors. As has already been stated, however, preference is given to transistors of the field-effect type because such transistors make possible a much higher current amplification factor (for example 1000×). The sources of the transistors $Q_1$ and $Q_2$ are interconnected as are their gates, and the width length ratio of the channel of the transistor $Q_1$ is substantially larger than that of the transistor $Q_2$. The transistor $Q_1$ has a channel length (measured from the source to the drain) of, for example, 3 μm and a width of 100 μm. The transistor $Q_2$, however, has a channel length of 100 μm and a channel width of 3 μm. The current through the transistor $Q_1$ will in such a case be 1000× larger than the current through the transistor $Q_2$.

When the voltage source 3 is switched on, the bulk of the charging current through the resistor 4 will initially flow through the transistor $Q_1$ and only a minor part thereof will reach the circuits $Q_2-C$ and the capacitance 2 and the resistance 1'. The capacitor C (for example, 1 pF), consequently, will be charged much more slowly (1000× slower in the above numerical example) than the rate corresponding to the time constant of the charging resistor 4, the capacitor C and the capacitance 2 alone. As the capacitor C is charged further, the transistors $Q_1$ and $Q_2$ will be gradually turned off so that the full programming voltage will reach the memory 1. After deactivation of the programming voltage source 3, the capacitor C will be discharged by means of the transistor 6.

Figure 2:
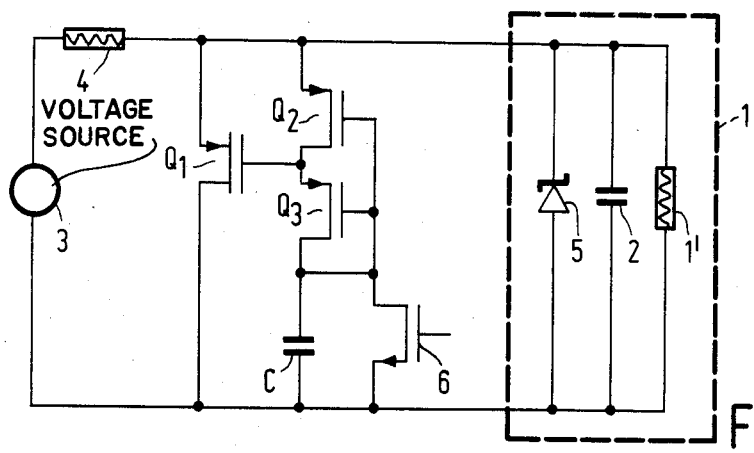
FIG. 2 shows an improvement of FIG. 1.

The current mirror shown can be extended in known manner in order to suppress disturbing effects due to process spreads. For example, in series with the transistor $Q_2$ there may be arranged a further transistor in cascadeconnection in order to suppress disturbing feedback from the drain to the gate. In the version shown in FIG. 2 an additional transistor $Q_3$, which is connected as a voltage follower, is connected between the transistor $Q_2$ and the capacitor C. The gate of $Q_3$ is connected to the capacitor and the voltage follower electrode (the source in the case shown) is connected to the gate of the transistor $Q_1$. When the (gate-source) threshold voltage (at which the transistor starts to conduct current) of the transistor $Q_1$ is higher than the difference between the threshold voltages of the transistors $Q_2$ and $Q_3$ (as will generally be the case), it is ensured that the transistor $Q_1$ will cease to conduct current sooner than the transistors $Q_2$ and $Q_3$. In order to ensure that the current through the transistor $Q_1$ still remains many times larger than that through the transistor $Q_2$, the width/length ratio of the channel of the transistor $Q_3$ should be substantially larger than that of the transistor $Q_2$, for example at least 10× larger.

The transistors $Q_1$ and $Q_2$ (and also $Q_3$) can in principle also be constructed as N-channel field-effect transistors, instead of P-channel field-effect transistors as shown.

Figure 3:
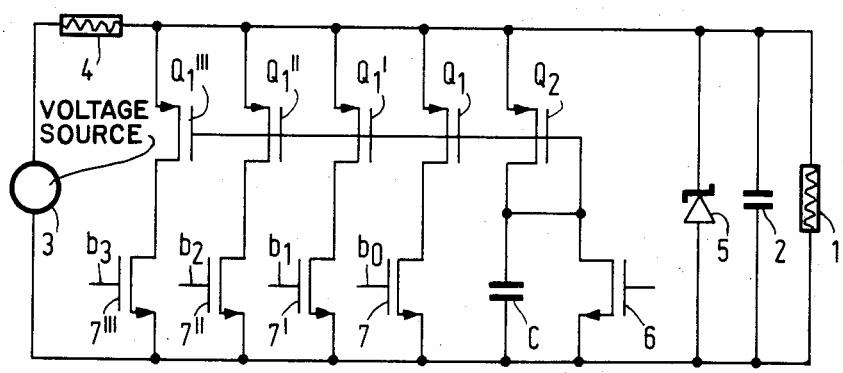
FIG. 3 shows an alternative to FIG. 1.

Finally, FIG. 3 shows how it can be ensured, regardless of the value of the stray capacitance 2 of the (E/EPROM) memory connected to the source 3, that the voltage rise per unit of time always remains below the safe limit value. To this end, the transistor $Q_1$ is of a multiple construction, i.e. further transistors $Q_1'$, $Q_1''$ etc., are connected in circuits in parallel with the original transistor $Q_1$. These further transistors can be switched on as desired in accordance with the magnitude of the (stray) capacitance of the memory (section) to be connected. The width/length ratios of the channels of these transistors $Q_1'$, $Q_1''$ etc. are chosen to be different, for example 150/3, 300/3 etc., so that the current amplification from the transistor $Q_2$ to the transistor $Q_1$ and/or $Q_1'$ (and/or $Q_1''$ etc.) can be adjusted. Using the value of the width/length ratio of the transistors shown in FIG. 3, a fictitious capacitor $C_f$ is obtained amounting to:

$$C_f = (50 \cdot B + 1) \cdot C,$$

in which B is the decimal value of the binary number, $b_3 b_2 b_1 b_0$ ($b_i$ ($3 \geq i \geq 0$) has the value 1 or 0, when the associated transistor is turned on or off, respectively).

What is claimed is:

1. A circuit for generating a programming voltage for an erasable programmable read-only memory having a memory section bridged by a capacitance comprising: a voltage source connected via a charging resistor to the memory section to be programmed, a first transistor connected in parallel circuit with the memory section bridged by the capacitance, a capacitor and a second transistor connected in a series circuit that is in turn connected in parallel with the capacitance of the memory section, said first and second transistors being connected as a current mirror which amplifies current from the second to the first transistor, and means coupling the capacitor to a control electrode of the first transistor so that the first transistor is controlled by a voltage on the capacitor.

2. A circuit as claimed in claim 1 further comprising a third transistor connected between said second transistor and the capacitor, said third transistor being connected as a voltage follower having a control electrode connected to said capacitor and a voltage follower electrode connected to the control electrode of said first transistor.

3. A circuit as claimed in claim 2 wherein the first, second and third transistors each comprise a field-effect transistor, characterized in that the width/length ratio of the channel of the third transistor exceeds that of the second transistor.

4. A circuit as claimed in claim 4 wherein the first and second transistors comprise field-effect transistors with the width/length ratio of the channel of the first transistor being substantially larger than that of the second transistor.

5. A circuit as claimed in claim 1 further comprising a third transistor connected in shunt with the capacitor, and means for triggering the third transistor into conduction to discharge the capacitor when the voltage source is deactivated.

6. A circuit as claimed in claim 1 further comprising a third transistor serially connected between the second transistor and the capacitor as a voltage follower, said first, second and third transistors each comprising a field effect transistor having a gate electrode, means connecting the gate of the third transistor to said capacitor and a voltage follower electrode thereof to the gate of the first transistor, and wherein the width/length ratio of the channel of the first transistor is an order of magnitude larger than the width/length ratio of the channel of the second transistor, and the width/length ratio of the channel of the third transistor exceeds the width/length ratio of the channel of the second transistor.

7. A circuit as claimed in claim 1 wherein the first and second transistors comprise field-effect transistors, said circuit further comprising one or more further field-effect transistors connected in parallel with the first transistor and having channels with mutually different width/length ratios, and means for selectively switching said further transistors on as determined by the capacitance of the memory section.

8. A circuit for generating a programming voltage for an erasable programmable read-only memory having a memory section bridged by a stray capacitance comprising: a charging circuit including a voltage source connected via a charging resistor to the memory section to be programmed, a shunt circuit connected in parallel with the charging circuit of the memory section and in parallel with the capacitance of said memory section, said shunt circuit including a first transistor having a control electrode, a capacitor connected in series with the conductance path of a second transistor and in parallel with the capacitance of said memory section, means coupling said capacitor to the control electrode of the first transistor so that said control electrode is controlled by a voltage on said capacitor, said first and second transistors being connected as a current mirror which amplifies current from the second to the first transistor.

9. A circuit as claimed in claim 8 wherein the first and second transistors comprise field-effect transistors, said circuit further comprising one or more further field-effect transistors connected in parallel with the first transistor and having channels with mutually different width/length ratios, and means for selectively switching said first and further transistors on so as to adjust the current amplifying factor of the current mirror formed by the selected transistors and the second transistor.

10. A circuit as claimed in claim 8 wherein the first and second transistors comprise field-effect transistors with the width/length ratio of the channel of the first transistor being substantially larger than the width/length ratio of the channel of the second transistor.

11. A circuit as claimed in claim 8 wherein said coupling means comprises a third transistor serially connected between the second transistor and the capacitor with a control electrode of the third transistor connected to said capacitor, said coupling means further comprising means connecting the control electrode of the first transistor to a junction point between the second and third transistors.

12. A circuit as claimed in claim 11 wherein said first, second and third transistors comprise field-effect transistors wherein the width/length ratio of the channel of the first transistor is substantially larger than the width/length ratio of the channel of the second transistor, and the width/length ratio of the channel the third transistor exceeds the width/length ratio of the channel of the second transistor.

13. A circuit for generating a programming voltage for an erasable programmable read-only memory comprising:

means for programming the memory including a voltage source and a charging resistor connected in series connection to a memory section having a capacitive load connected in parallel with the voltage source and resistor, a subcircuit coupled in parallel with the voltage source and resistor, said subcircuit comprising at least a first and second transistor and a capacitor, means connecting one main electrode of the first and second transistors to one side of the series connection of the voltage source and resistor, means connecting the second transistor and the capacitor in series between said one side of the series connection and the other side of said series connection of the voltage source and resistor, means coupling another main electrode of the first transistor to the other side of the series connection, means coupling the capacitor to the gate electrode of the first transistor whereby the first and second transistors are connected as a current mirror which amplifies current from the second transistor to the first transistor, and wherein the gate electrode of the first transistor is controlled by the voltage on the capacitor, said transistors comprising field-effect transistors wherein the first transistor has a width/length ratio at least an order of magnitude larger than the width/length ratio of the second transistor.

* * * * *

UNITED STATES PATENT AND TRADEMARK OFFICE
CERTIFICATE OF CORRECTION

PATENT NO. : 4,644,250

DATED : February 17, 1987

INVENTOR(S) : Cornelis D. Hartgring

It is certified that error appears in the above-identified patent and that said Letters Patent is hereby corrected as shown below:

IN THE CLAIMS

Claim 4, line 1    change "claim 4" to --claim 1--

Signed and Sealed this

Seventh Day of February, 1989

Attest:

DONALD J. QUIGG

Attesting Officer    Commissioner of Patents and Trademarks

UNITED STATES PATENT AND TRADEMARK OFFICE
CERTIFICATE OF CORRECTION

PATENT NO. : 4,644,250

DATED : February 17, 1987

INVENTOR(S) : Cornelis D. Hartgring

It is certified that error appears in the above-identified patent and that said Letters Patent is hereby corrected as shown below:

Column 2, line 42 change "charging" to --memory--

Signed and Sealed this

Fourth Day of July, 1989

Attest:

DONALD J. QUIGG

*Attesting Officer*

*Commissioner of Patents and Trademarks*